United States Patent [19]

Wakao et al.

[11] Patent Number: 4,726,031
[45] Date of Patent: Feb. 16, 1988

[54] SEMICONDUCTOR LASER

[75] Inventors: Kiyohide Wakao; Haruhisa Soda, both of Atsugi, Japan

[73] Assignee: Fujitsu Limited, Kawasaki, Japan

[21] Appl. No.: 784,594

[22] Filed: Oct. 4, 1985

[30] Foreign Application Priority Data

Oct. 9, 1984 [JP] Japan ............................. 59-210588

[51] Int. Cl.$^4$ .............................................. H01S 3/19
[52] U.S. Cl. ........................................ 372/96; 372/46
[58] Field of Search ...................... 372/96, 32, 45, 46

[56] References Cited

U.S. PATENT DOCUMENTS 4,096,446  6/1978  Haus et al. ............................. 372/96

FOREIGN PATENT DOCUMENTS 0000557  2/1979  European Pat. Off. .
0149462  7/1985  European Pat. Off. .
2537093  1/1977  Fed. Rep. of Germany .

OTHER PUBLICATIONS

Haus, "Antisymmetric Taper of Distributed Feedback Lasers", IEEE Journal of Quantum Electronics, vol. QE-12, No. 9, Sep. 1976, pp. 532-539.
Patent Abstracts of Japan, vol. 6, No. 140, Jul. 29, 1982, & JP-A-57 63 880.
Elektronics International, vol. 54, No. 23, Nov. 1981, "1.5 μm Laser Operates at 23 Degree C", by Cohen, pp. 68-70.
Journal of Applied Physics, vol. 43, No. 5, May 1972, "Coupled-Wave Theory of Distributed Feedback Lasers", by H. Kogelnik et al., pp. 2327-2335.
Electronics Letters, vol. 20, No. 2, Jan. 19, 1984, "Proposal of a Distributed Feedback Laser with Nonuniform Stripe Width for Complete Single-Mode Oscillation", Tada et al., pp. 82-84.
Electronics Letters, vol. 20, No. 24, Nov. 22, 1984, "GaInAsP/InP Phase-Adjusted Distributed Feedback Lasers with a Step-Like Nonuniform Stripe Width Structure", Soda et al., pp. 1016-1018.

Primary Examiner—James W. Davie
Attorney, Agent, or Firm—Staas & Halsey

[57] ABSTRACT

A semiconductor laser including a stripe-shaped active layer, a clad region, and a diffraction grating. The stripe-shaped active layer has a thickness in a first direction, has a first energy gap, and extends in a second direction orthogonal to the first direction. The clad region surrounds the stripe-shaped active layer, and has a second energy band gap greater than the first energy band gap. The diffraction grating is provided in parallel with and adjacent to, the stripe-shaped active layer. The stripe-shaped active layer has a first portion with a first light propagation constant and with a first dimension in a third direction orthogonal to the first and second directions, and has a second portion with a second light propagation constant and with a second dimension in the third direction. The first dimension and the second dimension are different from each other. The second portion has a length L in the second direction. The stripe-shaped active layer satisfies the condition that a product of $\Delta\beta$ and L is an odd multiple of $\pi/2$, where $\Delta\beta$ is a difference between the first and second light propagation constants.

26 Claims, 21 Drawing Figures

SEMICONDUCTOR LASER

BACKGROUND OF THE INVENTION

1. Field of the Invention

The present invention relates to a semiconductor laser of the distributed feedback (DFB) type having a construction appropriate for single-mode oscillation.

2. Description of the Related Art

Considerable development work is underway in general on semiconductor lasers with oscillation wavelengths of 1.5 to 1.6 micrometers due to the minimal loss of light of that wavelength band in transmission in optical fibers.

If a semiconductor laser of this conventional type, i.e., a Fabry-Perot type semiconductor laser, is used for high speed modulation, it cannot maintain the wavelength monochromatically and numerous wavelengths result. If such signal light is introduced into and transmitted through an optical fiber, the light which is output from it results in degradation of the waveform because refractive indexes (and thus the propagation speeds) for respective wavelengths are different due to the differences in dispersion in the material of the optical fiber itself. Such a signal therefore ends up with a great amount of noise at the receiving side, so that it is not practical for use.

In recent years, therefore, development has been underway on DFB type semiconductor lasers. Good results have been obtained.

A DFB type semiconductor laser has, formed on the active layer itself or close thereto, a diffraction grating known as a "corrugation" or just a "grating". Light travels back and forth and resonates in the active layer under the influence of the diffraction grating.

In such a DFB type semiconductor laser, theoretically, it is considered possible to maintain monochromatic wavelength oscillation even when modulating at a high speed of several hundred M bits/sec. In practice, however, this is very difficult. The reason for this is that the corrugation in the afore-mentioned DFB type laser is formed uniformly and, therefore, the corrugation has a uniform structure without discontinuity of the corrugation. In other words, a so-called symmetric DFB type semiconductor laser is formed in which, since the losses in the two longitudinal modes symmetrically occurring on the two sides of the side center are equal, dual-mode oscillation can take place or oscillation can transfer between two resonance modes differing by just plus or minus the same wavelength from the Bragg wavelength corresponding to the period of the corrugations, resulting in unstable oscillation. Therefore, a so-called $\Lambda/2$ shift DFB type semiconductor laser ($\Lambda$=corrugation period) has been developed to eliminate this problem.

A conventional $\Lambda/2$ shift DFB type semiconductor laser has a structure in which, seen from the side center, the corrugation of the right side or the left side is shifted by just $\Lambda/2$. The $\Lambda/2$ shift DFB type semiconductor laser can oscillate with a single mode at the Bragg wavelength. The oscillation characteristics of the $\Lambda/2$ shift DFB type semiconductor laser are extremely superior.

There are, however, considerable problems in the manufacture of the $\Lambda/2$ shift DFB type semiconductor laser. Specifically, the period $\Lambda$ of the corrugation itself is as small as 0.3 to 0.4 micrometers, for example. Therefore, it is very difficult to manufacture the right and left two corrugations being shifted by exactly $\Lambda/2$ and being combined at the middle of the DFB laser without discontinuity of the corrugations.

To realize the same effect as in the conventional $\Lambda/2$ shift DFB type semiconductor laser, the IEEE Journal of Quantum Electronics, September 1976, page 534 suggests changing the thickness of the optical guide over a length short compared with the total length of the structure. This technique, however, also has a disadvantage in manufacturing, because it is very difficult to accurately control the thickness of the optical guide layer during crystal growing of the optical guide layer.

SUMMARY OF THE INVENTION

An object of the present invention is to provide a DFB type semiconductor laser having a structure enabling stable oscillation at the Bragg wavelength and, further, easy manufacture.

To attain the above object, there is provided, according to the present invention, a semiconductor laser comprising a stripe-shaped active layer, a clad region, and a diffraction grating. The stripe-shaped active layer has a thickness in a first direction, has a first energy gap, and extends in a second direction orthogonal to the first direction. The clad region surrounds the stripe-shaped active layer, and has a second energy band gap greater than the first energy band gap. The diffraction grating is provided in parallel and adjacent to the stripe-shaped active layer. The stripe-shaped active layer has a first portion with a first light propagation constant and with a first dimension in a third direction orthogonal to the first and second directions, and has a second portion with a second light propagation constant and with a second dimension in the third direction. The first dimension and the second dimension are different from each other. The second portion has a length L in the second direction. The stripe-shaped active layer satisfies the condition that a product of $\Delta\beta$ and L is an odd multiple of $\pi/2$, where $\Delta\beta$ is a difference between the first and second light propagation constants.

BRIEF DESCRIPTON OF THE DRAWINGS

The above object and the features of the present invention will be more apparent from the following description of the preferred embodiments with reference to the drawings, wherein FIG. 1 is a side cross-sectional view of a main portion of a conventional DFB type semiconductor laser;

DESCRIPTION OF THE PREFERRED EMBODIMENTS

Before describing the embodiments of the present invention, a conventional $\Lambda/2$ shift DFB semiconductor laser is described with reference to FIGS. 1, 2A, and 2B.

Figure 1:
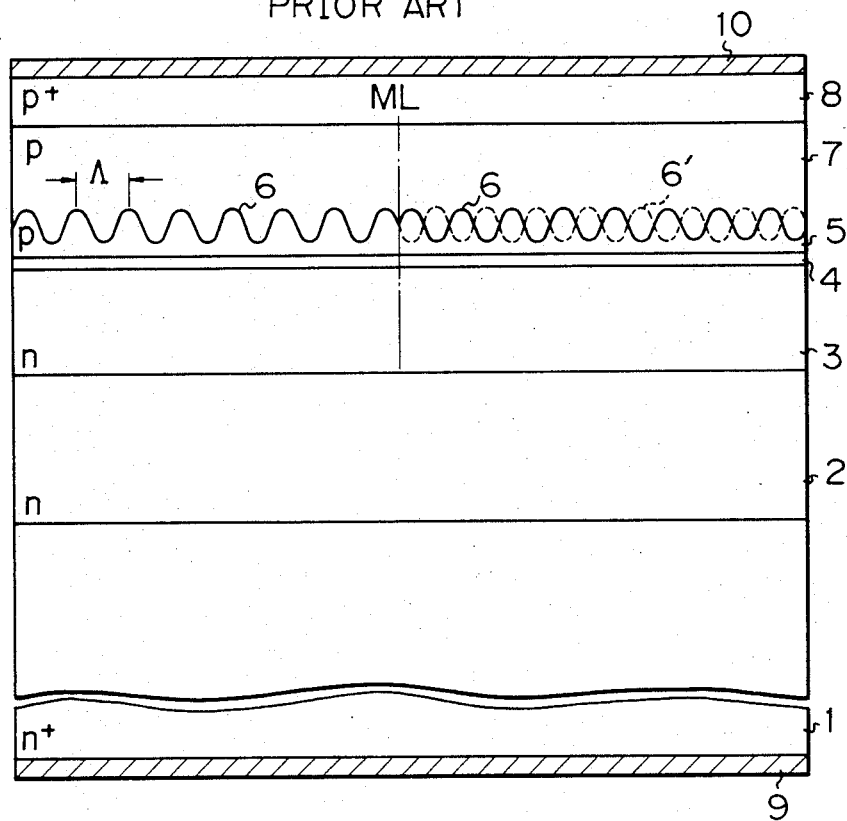

FIG. 1 is a side cross-sectional view of a main portion of a conventional $\Lambda/2$ shift DFB type semiconductor laser. In FIG. 1, 1 is an n+ type InP substrate, 2 an n type InP buffer layer, 3 an n type InP clad layer, 4 a nondoped InGaAsP active layer for conducting light of an oscillating wavelength $\lambda g$ equal to 1.3 $\mu m$, 5 a p type InGaAsP optical guide layer for conducting light of an oscillating wavelength $\lambda g$ equal to 1.2 $\mu m$, 6 corrugations, 6' a non-shifted corrugation, 7 a p type InP clad layer, 8 a p+ type InGaAsP contact layer, 9 an n side electrode, and 10 a p side electrode.

Before the $\Lambda/2$ shift DFB type semiconductor laser was developed, the non-shifted corrugation 6' as illustrated by a block curve was employed. The corrugation 6' is not shifted with respect to the corrugation 6 on the illustrated left side from the middle line ML. Because of this structure, the non-shifted type DFB laser has a disadvantage of unstable oscillation as previously mentioned. That is, as illustrated in FIG. 2A, the non-shifted type DFB laser theoretically oscillates at dual-mode oscillation at two frequencies $\lambda \beta \pm \alpha$, where $\lambda \beta$ is the Bragg frequency and $\alpha$ is a constant. In practice, due to a slight difference in physical characteristics of the corrugation 6 on the left side and the non-shifted corrugation 6' on the right side, the oscillation can transfer between the two resonance modes of the wavelengths $\lambda g \pm \alpha$.

In the conventional $\Lambda/2$ shift DFB type semiconductor laser, the corrugation 6 on the illustrated right side has a phase which is shifted by exactly $\Lambda/2$ from the phase of the corrugation 6 on the left side with respect to the middle line ML. The notation "$\Lambda$" represents the period of the corrugation 6. The illustrated $\Lambda/2$ shift DFB type semiconductor laser oscillates at a primary mode in which the length of two periods $2\Lambda$ of the corrugation 6 is equal to one wavelength $\lambda$ of light generated therein. In the primary mode the shift of the corrugation by exactly $\Lambda/2$ results in a shift of the light phase by $\lambda/4$.

A $\Lambda/4$ shift DFB type semiconductor laser (not shown) oscillates at a secondary mode in which the length of one period $\Lambda$ of corrugation is equal to one wavelength $\lambda$ of light generated therein. In the secondary mode, the shift of the corrugation by exactly $\Lambda/4$ results in the same shift of the light phase as $\Lambda/4$.

Figures 2A, 2B:
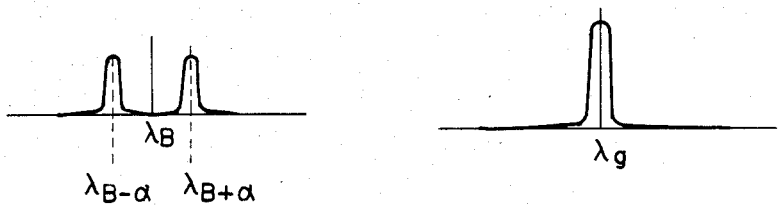
FIG. 2A is a graph explaining an undesired double-mode oscillation in the laser shown in FIG. 1.
FIG. 2B is a graph explaining a desired single mode oscillation in the laser shown in FIG. 1.

If the corrugation 6 on the right side can be manufactured to be shifted exactly $\Lambda/2$ and combined with the corrugation 6 at the left side without discontinuity, the above-mentioned disadvantage in the conventional non-shifted type DFB laser would disappear, so that the conventional $\Lambda/2$ shift DFB type semiconductor laser would provide superior oscillation characteristics of a single-mode oscillation as illustrated in FIG. 2B.

However, since the period $\Lambda$ of the corrugation 6 or 6' is as small as 0.3 to 0.4 $\mu m$ as described before, it is very difficult to manufacture the right corrugation 6 and left corrugation being shifted by exactly $\Lambda/2$ and being combined at the middle line ML without discontinuity of the corrugations.

Now, embodiments of the present invention will be described. Throughout the description and drawings, the same portions are represented by the same reference symbols.

Figure 3A:
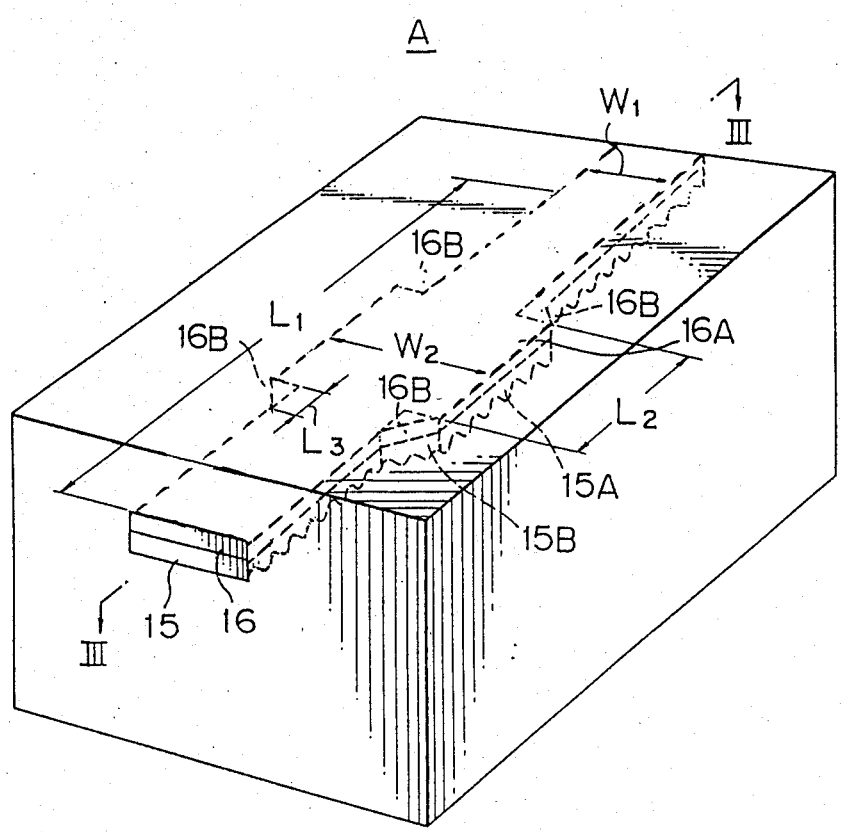
FIG. 3A is a perspective view of the structure of a main portion of a semiconductor laser according to an embodiment of the present invention.
Figure 3B:
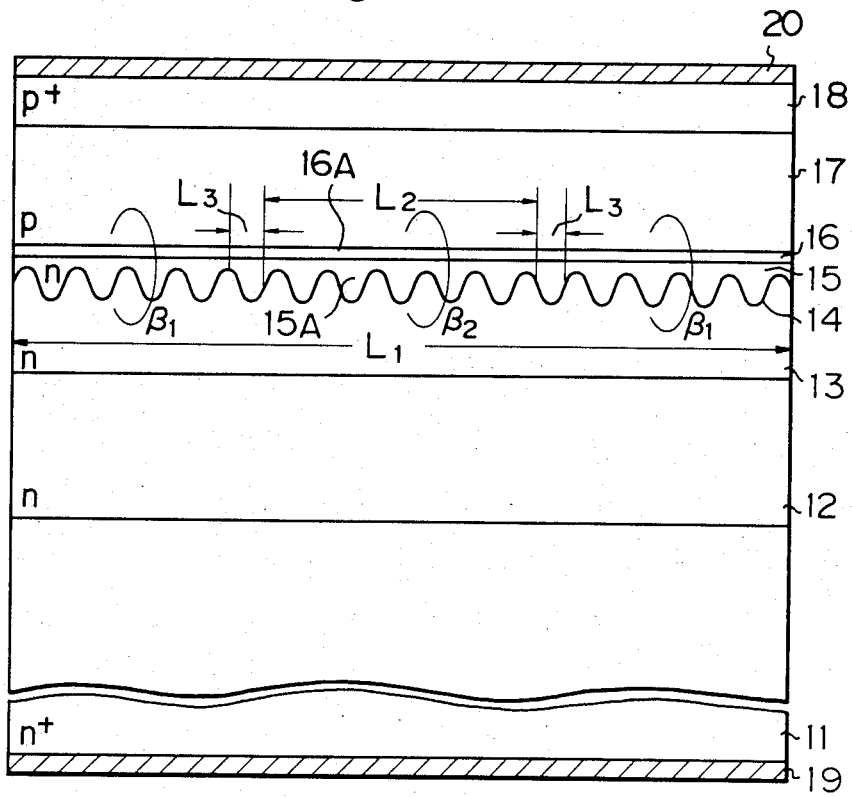
FIG. 3B is a side cross-sectional view of the laser taken along line III—III of FIG. 3A.

FIG. 3A is a perspective view of the structure of a main portion of a semiconductor laser according to a first embodiment of the present invention. FIG. 3B is a side-cross sectional view of the laser taken along line III—III of FIG. 3A.

In FIG. 3B, on an n+-type InP (Indium Phosphorus) substrate 11, an n-type InP buffer layer 12 is formed. An n-type InP clad layer 13 is formed on the n-type InP buffer layer 12. A corrugation 14 is formed in an n-type InGaAsP (Indium Gallium Arsecenic Phosphorus) optical guide layer 15 which is formed on the n-type InP clad layer 13. The corrugation 14 is also referred to as a diffraction grating. The n-type InGaAsP optical guide layer 15 can transfer light with the wavelength equal to 1.2 $\mu m$ which corresponds to the forbidden bandwidth of the layer 15. However, this layer 15 does not actually generate the light. An InGaAsP (Indium Gallium Arsenic Phosphorus) active layer 16 is formed on the n-type InGaAsP optical guide layer 15. The InGaAsP active layer can generate light with the wavelength equal to 1.3 $\mu m$. In this embodiment, the n-type InGaAsP optical guide layer 15 and the InGaAsP active layer 16 have, at their middle portions, expanded width portions 15A and 16A. The perspective view shown in FIG. 3A illustrates the above-mentioned structure. As can be seen from FIG. 3A, the n-type InGaAsP optical guide layer 15 and the InGaAsP active layer 16 are stripe-shaped. Referring back to FIG. 3B, on the InGaAsP active layer 16, a p-type InP clad layer 17 is further formed. Finally, a p+-type InGaAsP contact layer 18 is formed on the p-type InP clad layer 17. An n side electrode plate 19 is formed under the n+-type InP substrate 11. A p-side electrode plate 20 is formed on the p+-type InGaAsP contact layer 18.

In the semiconductor laser A, assume that the direction of the thickness from the n side electrode plate 19 to the p-side electrode plate 20 is a first direction; the extending direction of the stripe-shaped optical guide layer 15 and the stripe-shaped active layer 16 is a second direction; and the direction of the width of the optical guide layer 15 or the active layer 16 is a third direction.

Then, the length of the active layer 16 in the second direction is $L_1$; and the length of the expanded width portion 15A or 16A in the second direction is $L_2$ which is shorter than $L_1$. The corrugation 14 is formed uniformly without any shift. The expanded width portions 15A and 16A have, at their corners, tapered portions 15B and 16B over which the optical guide layer 15 and the active layer 16 gradually extends. The tapered portions have their lengths in the second direction equal to $L_3$. The expanded widths portions 15A and 16A have their width $W_2$ in the third direction.

When an electric voltage is applied between the n side electrode plate 19 and the p side electrode plate 20, light is generated mainly in the active layer 16. The generated light conducts through the active layer 16 and its periphery. In the region of the nonexpanded width portion of the active layer 16, the light conducts at a propagation constant $\beta_1$. In the region of the expanded width portion 16A, the light conducts at another propagation constant $\beta_2$.

To enable oscillation of a monochromatic wavelength, that is, to enable a single-mode oscillation, it is sufficient to shift the phase of the light by just $\lambda/4$, where $\lambda$ is the wavelength of the light. By appropriately determining the width $W_2$ of the expanded width portions 15A and 16A, the propagation constant in the light waveguide region can be changed from $\beta_1$ to $\beta_2$ and thus the refractive index effectively changed. Therefore, it is possible to shift the phase of the propagated light by exactly $\Lambda/4$.

As will be apparent to those skilled in the art, the formation of the expanded width portions can be easily realized by utilizing a mask. Thus, the shift of the corrugation is not necessary. Also, the control of the thickness of the active layer 16 or the optical guide layer 15 is not so critical.

Figure 4:
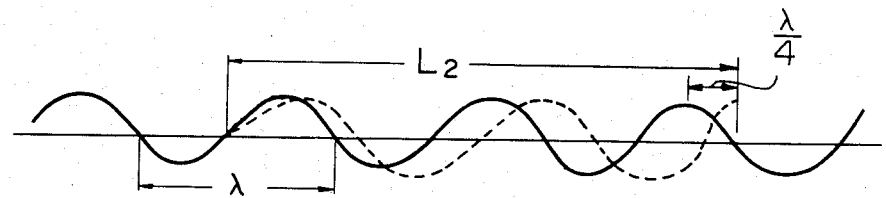
FIG. 4 is a graph explaining phase shift of light in the structure shown in FIG. 3B.

FIG. 4 is a graph explaining the phase shift of light in the structure shown in FIG. 3B. From the figure, it will be understood that the phase of light with the propagation constant $\beta_2$ delays by $\lambda/4$ after the propagation through the length $L_2$, in comparison with the phase of light with the propagation constant $\beta_1$. Here, if the Bragg wavelength is $\lambda_b$ and the effective refractive index is $n_{eff}$, then the period $\Lambda$ of the corrugation 14, in the secondary mode as an example, is expressed as:

$$\Lambda = \lambda_b / n_{eff}$$

Further, the differential propagation $\Delta\beta$ can be expressed as $$\Delta\beta = \beta_2 - \beta_1$$

In the present embodiment, $\beta_2 > \beta_1$, so $\Delta\beta$ is positive.

If the effective differential refractive index, to change of the propagation constants of the light and to shift in light phase, is $\Delta n$, the relation between $\Delta n$ and the length L of the portion with the different propagation constant ($L_2$ in FIG. 3B) is given by the following, assuming the oscillation frequency of the free space is $\lambda$:

$$\frac{2\pi\Delta n}{\lambda} L = \frac{\pi}{2}$$

Therefore, when the oscillation wavelength $\lambda$ and the effective differential refractive index $\Delta n$ are determined, it is possible to find, from the above equation, the length L of the portion with the different propagation constant. Further, since $$\Delta\beta = \frac{2\pi\Delta n}{\lambda}$$

then $$\Delta\beta L = \pm \frac{\pi}{2} \pm m\pi \text{ (m is an integer)}$$

By satisfying this equation, stable oscillation of a monochromatic wavelength (Bragg wavelength $\lambda_b$) is possible.

The dimensions of the important portions in the illustrated example are as follows:
$W_1 = 1.8$ micrometers ($\mu$m)
$W_2 = 2.5$ micrometers ($\mu$m)
$L_1 = 400$ micrometers ($\mu$m)
$L_2 = 60$ micrometers ($\mu$m)
$L_3 = 5$ micrometers ($\mu$m)

In this embodiment, in forming the expanded width portions 15A and 16A in the active layer 16, the width is gradually increased over the length $L_3$.

In other words, the four corners of the expanded width portion 16A are formed so as to be tapered. The tapered portions 15B and 16B are formed because due consideration must be given to occurrence of possible defects at the boundary region in the case of a rapid increase in the width, which would detrimentally affect the characteristics of the active layer 16 or the expanded width portion 16A. If no such problems would arise, the gently increased width portion could be eliminated, as shown by the broken line in the figure. Experiments showed that no trouble occurred even when the gently increased width portion was eliminated.

FIGS. 5A through 5D show the manufacturing steps of the laser shown in FIG. 3A.

Figure 5A:
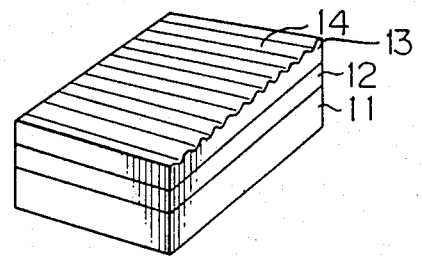
FIGS. 5A through 5D are perspective-view diagrams explaining the manufacturing steps of the laser shown in FIG. 3A.

In FIG. 5A, the n+-type InP sustrate 11, the n-type InP buffer layer 12, and the n-type InP clad layer 13 are formed. On the clad layer 13, the corrugation 14 is uniformly formed. Since it is not necessary to form any shift portion in the corrugation 14, the manufacture of the corrugation 14 is relatively easy.

Figure 5B:
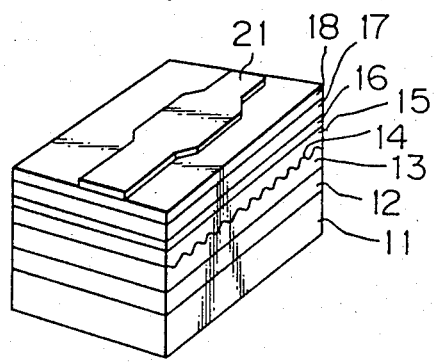
Figure 5C:
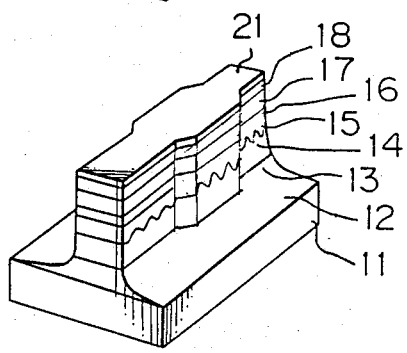
Figure 5D:
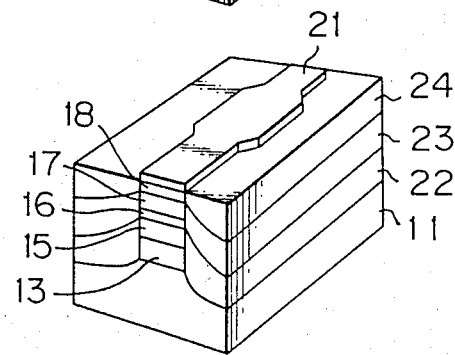

After forming the corrugation 14, the device shown in FIG. 5A is subjected to crystal growth. Then, as shown in FIG. 5B, the n-type InGaAsP optical guide layer 15, the n-type InGaAsP active layer 16, the p-type InP clad layer 17, and the p+-type InGaAsP contact layer 18 are sequentially formed. Then, on the p+-type InGaAsP contact layer 18, a mask 21 made of silicon dioxide (SiO$_2$) is formed. The mask 21 is used to realize the stripe-shaped layers. That is, by using the mask 21, an etching process is carried out on the device shown in FIG. 5B, resulting in the clad layer 13, the optical guide layer 15, the active layer 16, the clad layer 17, and the contact layer 18 to be stripe-shaped. After this, a p-type InP layer 22, an n-type InP layer 23, and a p-type InP layer 24 are formed on the etched portion by crystal growth. Thus, the semiconductor laser $\underline{A}$ shown in FIG. 3B is formed.

Figure 6:
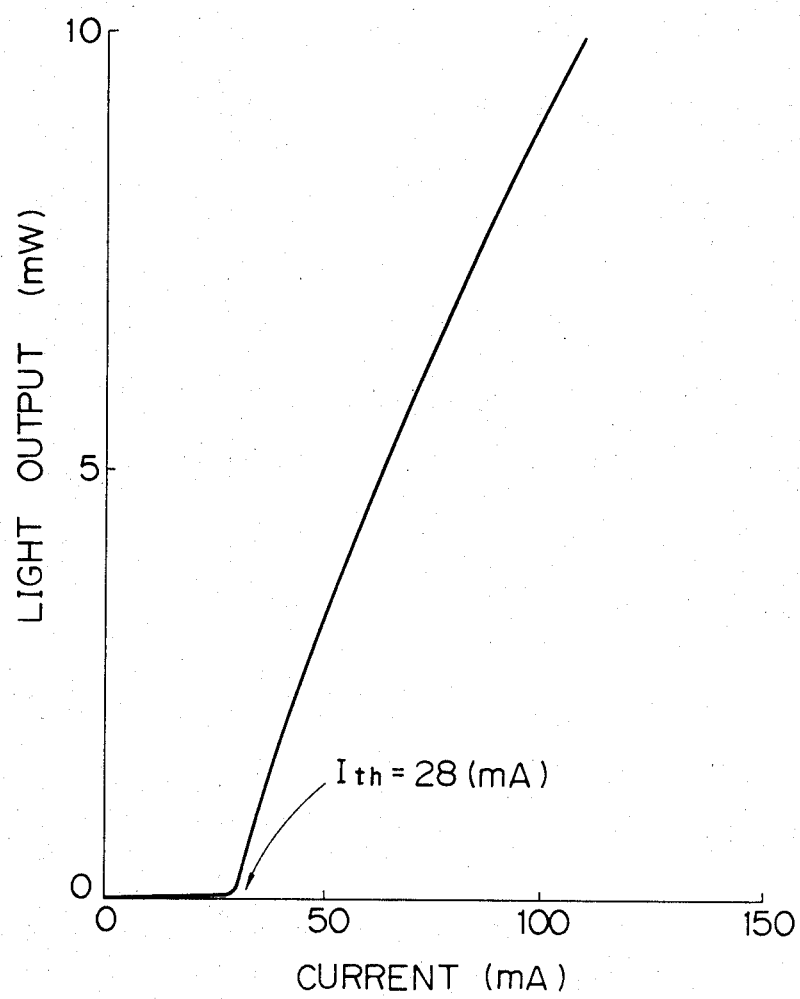
FIG. 6 is a graph explaining the relationship between the electric current and the light output in the laser shown in FIG. 3B.

FIG. 6 is a graph showing the relationship between the light output and current in the embodiment explained with reference to FIG. 3A and FIG. 3B. In the figure, the ordinate indicates the light output and the abscissa the current. As is clear from the figure, in the above-mentioned embodiment, the value of the threshold current $I_{th}$ is 28 mA. The light output rapidly rises after that value.

Figure 7:
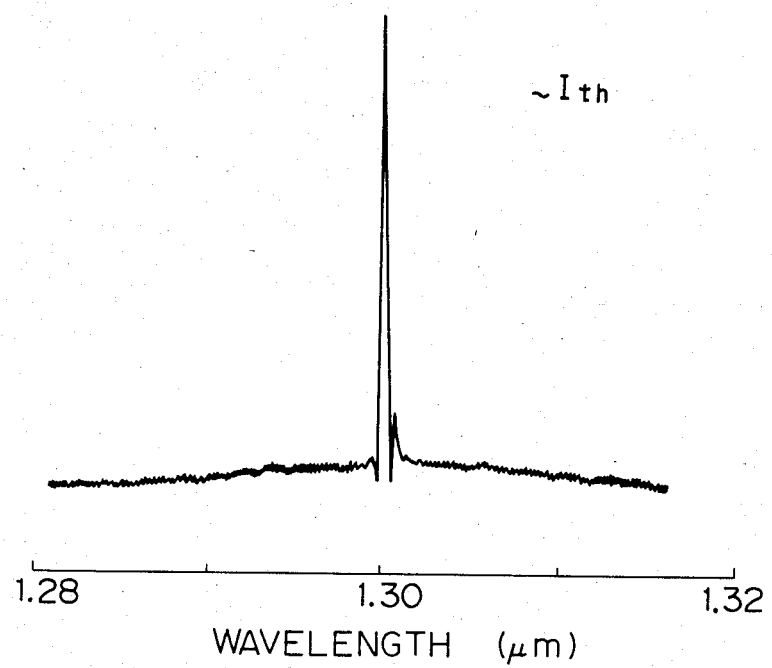
FIG. 7 is a graph explaining a spectrum at an oscillating wavelength when the threshold current is conducted through the laser shown in FIG. 3B.

FIG. 7 is a graph showing the oscillation wavelength spectrum of the embodiment explained with reference to FIG. 3A and FIG. 3B. This data was obtained by passing a current of a value close to the threshold current $I_{th}$ for oscillation. From the figure, it will be understood that the oscillation is performed at a Bragg wavelength $\lambda_b = 1.3$ micrometers and that the existence of sharp drops in the spectrum at both sides of the oscillation can be observed. By this, the oscillation is stable.

Figure 8:
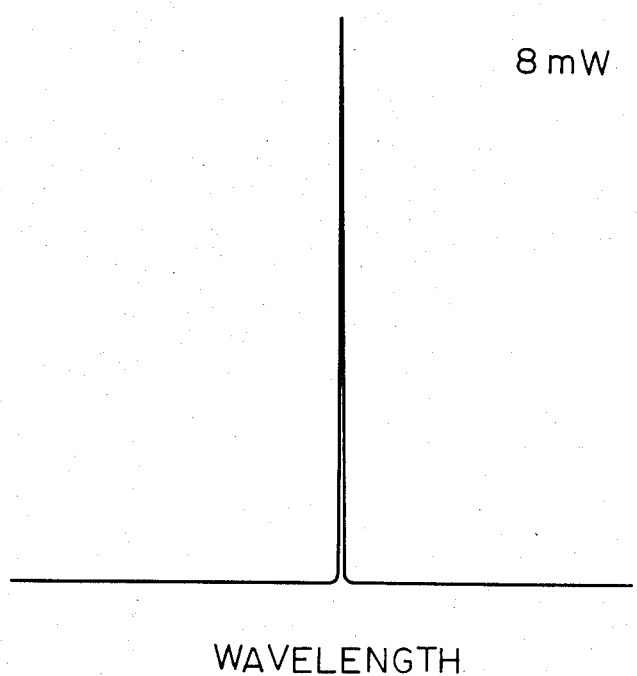
FIG. 8 is a graph explaining a spectrum at an oscillating wavelength when the light output power is selected to be 8 miliwatts in the laser shown in FIG. 3B.

FIG. 8 is a graph showing the oscillation wavelength spectrum for the case where the light output of the embodiment explained with reference to FIG. 3A and FIG. 3B is 8 mW. From this figure, it will be discerned that oscillation is performed at a stable monochromatic wavelength no matter what the light output.

Figure 9:
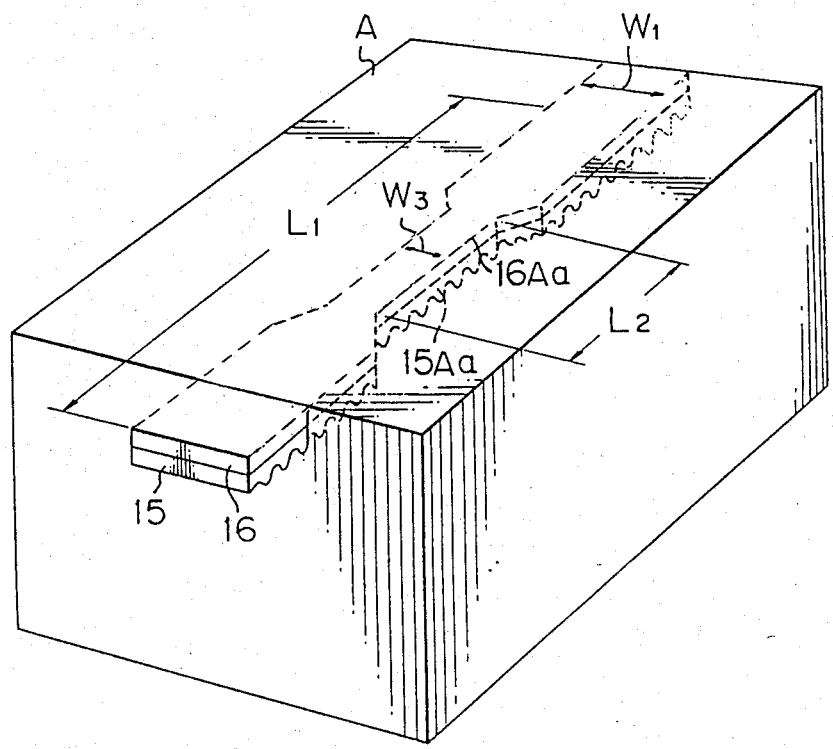
FIG. 9 is a perspective view of the structure of a main portion of a semiconductor laser according to another embodiment of the present invention.

FIG. 9 is a perspective view of the structure of a semiconductor laser according to a second embodiment of the present invention. The difference between the embodiment shown in FIG. 3A and the embodiment shown in FIG. 9 is that, in place of the expanded width portions 15A and 16A in the laser shown in FIG. 3A, narrowed width portions 15Aa and 16Aa are provided in the stripe-shaped optical guide layer 15 and in the stripe-shaped active layer 16. The width of the narrowed width portions 15Aa and 16Aa is W3 which is smaller than W1. The width W3 is appropriately determined so as to shift the phase of the propagated light by exactly $\lambda/4$.

Figure 10:
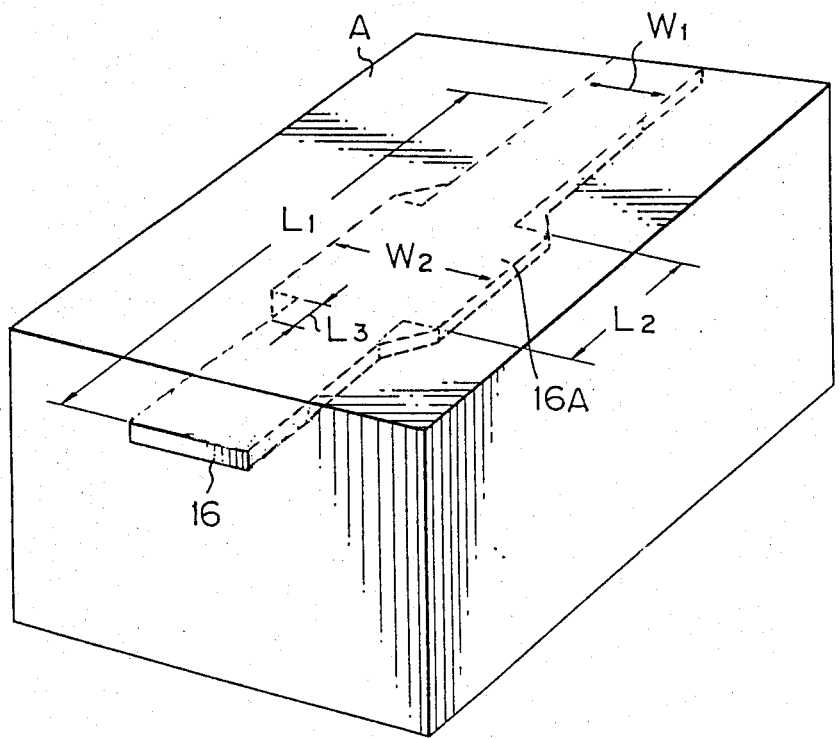
FIG. 10 is a perspective view of the structure of a main portion of a semiconductor laser according to still another embodiment of the present invention.

FIG. 10 is a perspective view of the structure of a semiconductor laser according to a third embodiment of the present invention. The difference between the embodiment shown in FIG. 3A and the embodiment shown in FIG. 10 is that, in place of the two stripe-shaped layers 15 and 16 in the laser shown in FIG. 3A, only the active layer 16 having the expanded width portion 16A is made to be stripe-shaped. This structure also enables the shift of the phase of the propagated light by exactly $\lambda/4$, because most of the light is propagated through the active layer 16.

Figure 11:
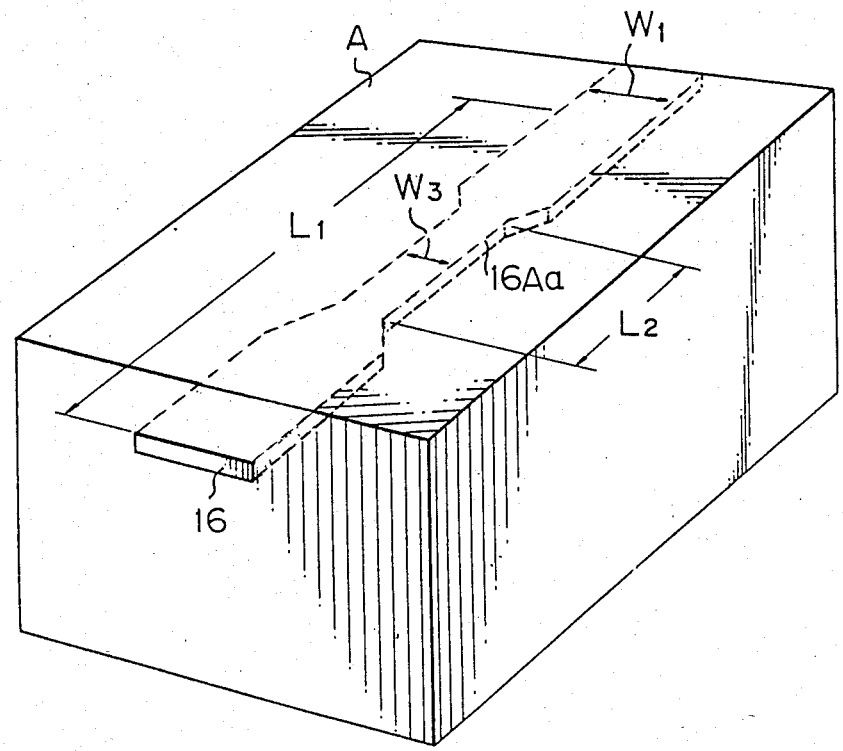
FIG. 11 is a perspective view of the structure of a main portion of a semiconductor laser according to a still further embodiment of the present invention.

FIG. 11 is a perspective view of the structure of a semiconductor laser according to a fourth embodiment of the present invention. The difference between the embodiment shown in FIG. 9 and the embodiment shown in FIG. 11 is that, in place of the two stripe-shaped layers 15 and 16 in the laser shown in FIG. 9, only the active layer 16 having the narrowed width portion 16Aa is made to be stripe-shaped. This structure also enables the shift of the phase of the propagated light by exactly $\lambda/4$.

Figure 12A:
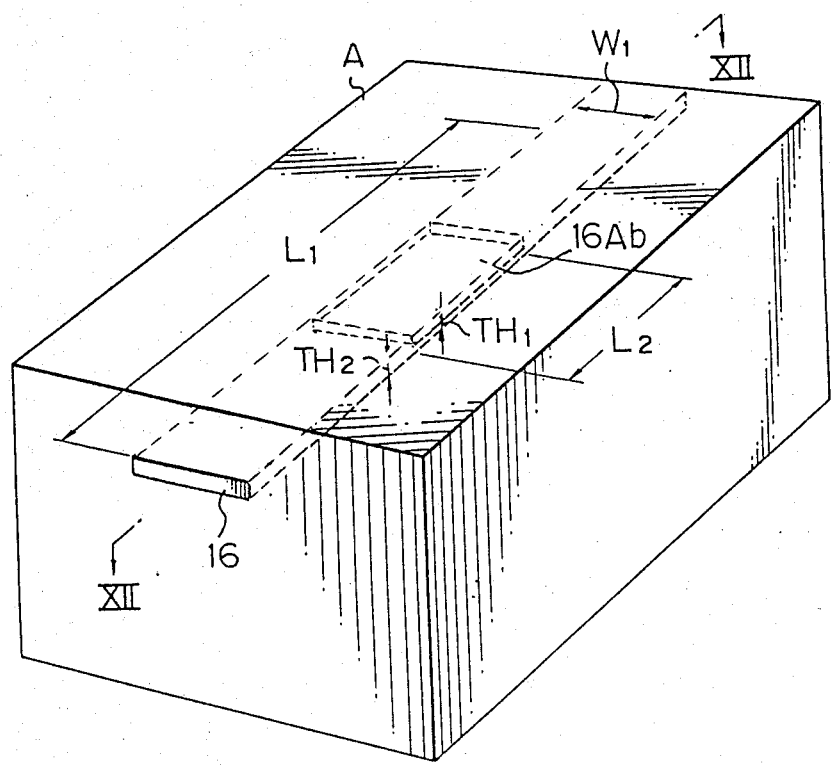
FIG. 12A is a perspective view of the structure of a main portion of a semiconductor laser according to still another embodiment of the present invention.
Figure 12B:
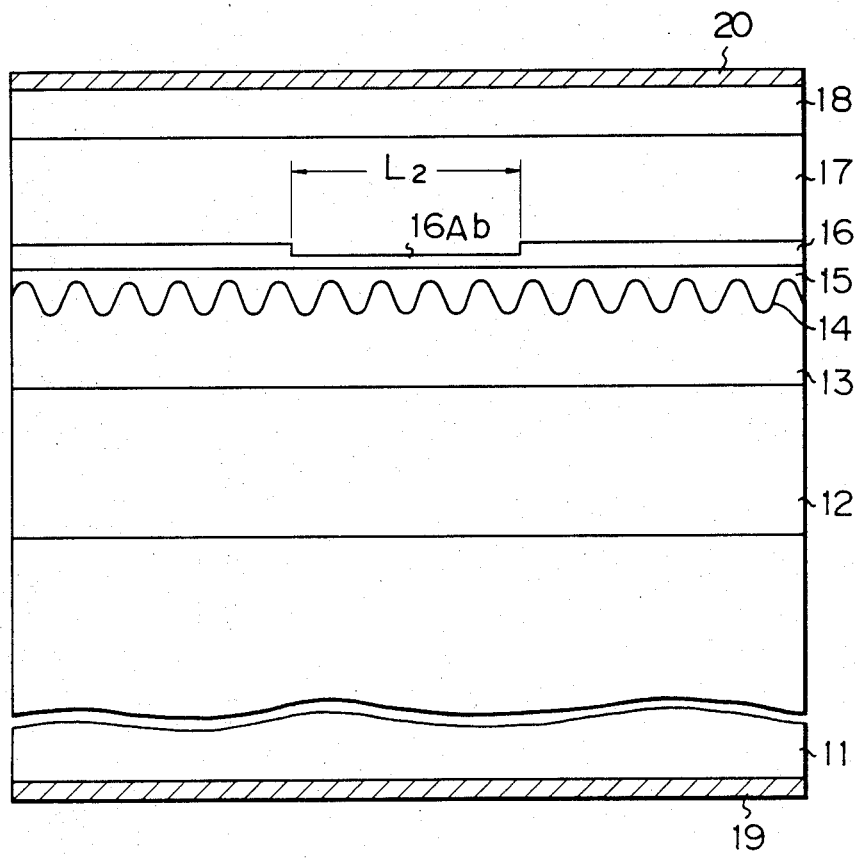
FIG. 12B is a side cross-sectional view of the laser taken along line XII—XII of FIG. 12A.

FIG. 12A is a perspective view of the structure of a semiconductor laser according to a fifth embodiment of the present invention. FIG. 12B is a side cross-sectional view of the laser taken along line XII—XII of FIG. 12A. The difference between the embodiment shown in FIG. 10 and the embodiment shown in FIGS. 12A and 12B is that, in place of the expanded width portion 16A in the laser shown in FIG. 10, a recessed portion (thin portion) 16Ab, having a thickness $TH_1$ smaller than the thickness $TH_2$ of the stripe-shaped active layer 16, is provided in place of the expanded width portion 16A. The formation of the thin portion 16Ab in the active layer 16 results in a different light propagation constant. $\Delta\beta L$ in this embodiment is—$\pi/2$.

Figure 13A:
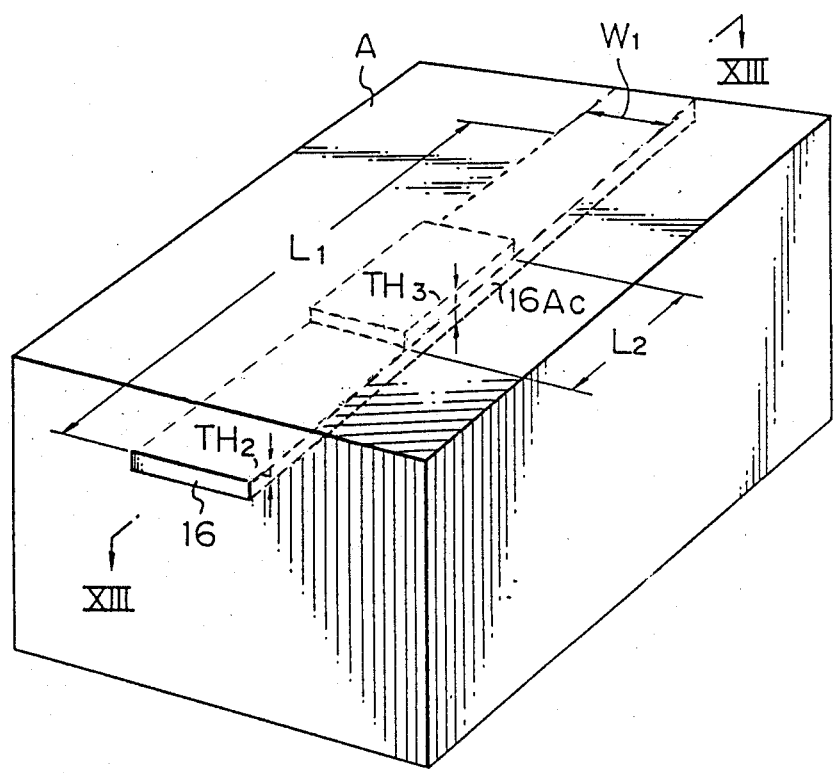
FIG. 13A is a perspective view of the structure of a main portion of a semiconductor laser according to a still further embodiment of the present invention.
Figure 13B:
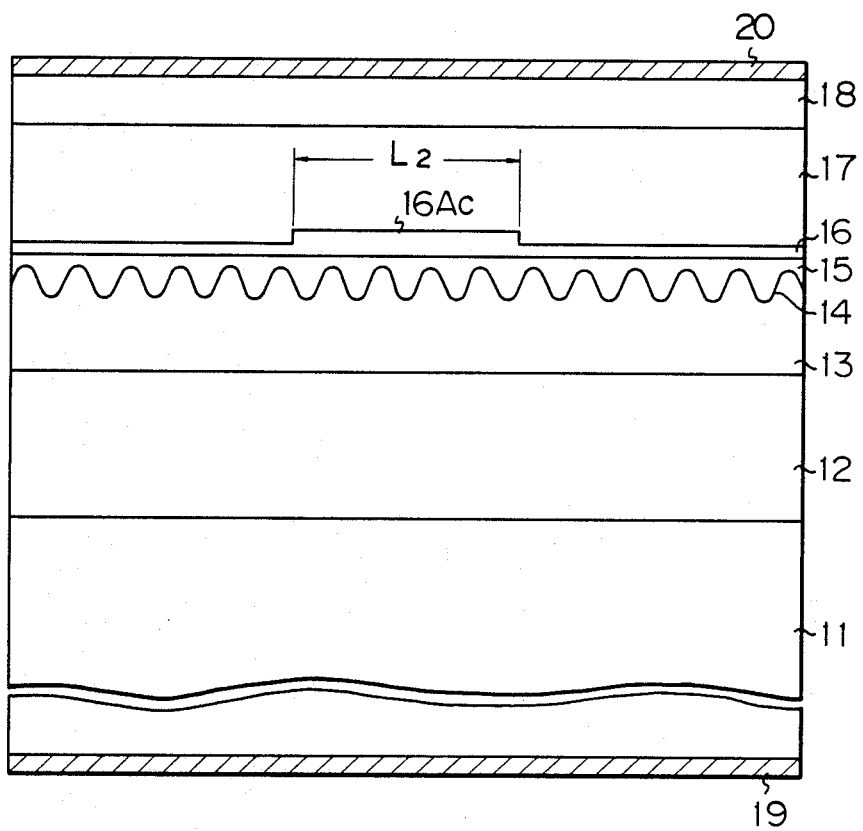
FIG. 13B is a side cross-sectional view of the laser taken along line XIII—XIII of FIG. 12A.

FIG. 13A is a perspective view of the structure of a semiconductor laser according to a sixth embodiment of the present invention. FIG. 13B is a side cross-sectional view of the laser taken along line XIII—XIII of FIG. 13A. In FIGS. 13A and 13B, a thick portion 16Ac, having a thickness $TH_3$ larger than the thickness $TH_2$ of the stripe-shaped active layer 16, is provided in place of the thin portion 16Ab in the laser shown in FIGS. 12A and 12B. In this embodiment, the formation of the thick portion 16Ac in the active layer 16 results in a different light propagation constant. $\Delta\beta L$ in this embodiment is $\pi/2$.

Figure 14:
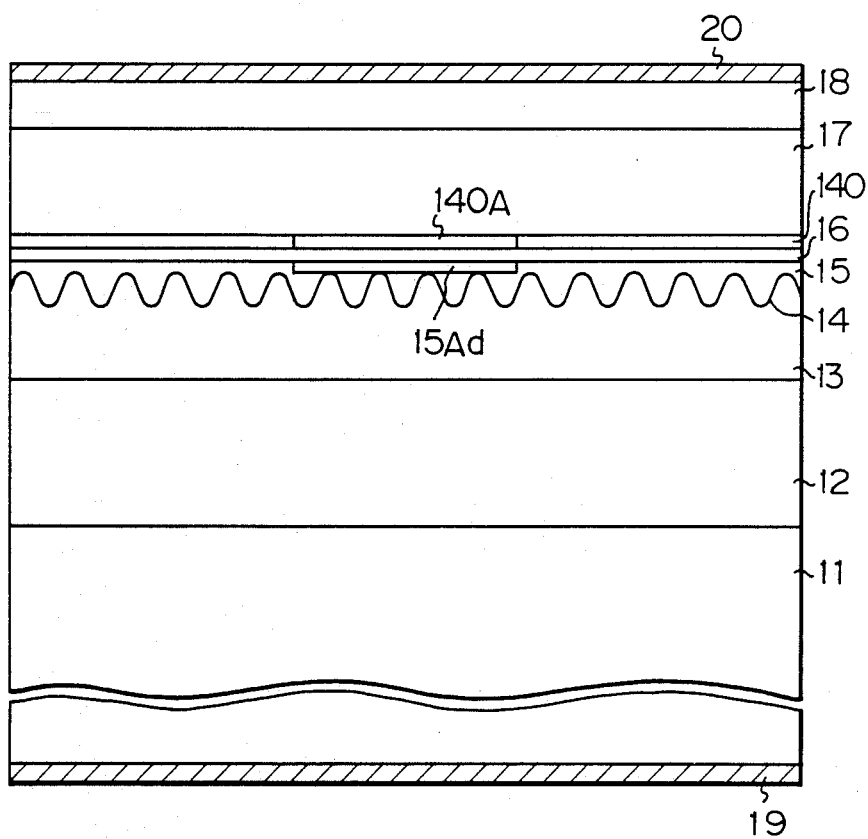
FIG. 14 is a side cross-sectional view of a semiconductor laser according to a still further embodiment of the present invention.

FIG. 14 is a side cross-sectional view of a semiconductor laser according to a seventh embodiment of the present invention. In this embodiment, a second optical guide layer 140 is formed on the active layer 16. A portion 140A with a composition different from a composition in the other portion of the second optical guide layer 140 is formed in the second optical guide layer 140. This selective formation of the portion 140A also results in a different propagation constant. A selective formation of a period 15Ad with a composition different from a composition in the other portion in the optical guide layer 15 may also result in a different propagation constant.

From the foregoing description, it will be apparent that, in the semiconductor laser of the present invention, a portion of a different propagation constant is selectively formed on a part of the light waveguide region and the following equation is satisfied:

$$\Delta\beta L = \pm \frac{\pi}{2} \pm m\pi \ (m \text{ is an integer}),$$

wherein $\Delta\beta$ is the differential propagation constant between the portion with the different propagation constant and other portions, and L is the length of the portion with the different propagation constant.

By such a construction, the semiconductor laser can stably oscillate at a monochromatic wavelength, i.e., the Bragg wavelength. Further, the construction for enabling this i.e., for selectively creating the portion with the different propagation constant in a part of the light waveguide region, is much simpler compared with a conventional $\lambda/2$ shift DFB semiconductor laser, as can be understood from the above embodiments, thus also making reproducibility excellent.

What is claimed is:

1. A semiconductor laser comprising:

a stripe-shaped active layer having a thickness in a first direction, having a first energy band gap, and extending in a second direction orthogonal to the first direction;

a clad region surrounding said stripe-shaped active layer, having a second energy band gap greater than the first energy band gap and having first and second portions;

first and second electrodes adjacent to said first and second portions of said clad region, respectively; and a diffraction grating provided in parallel with, and adjacent to, said stripe-shaped active layer, said stripe-shaped active layer having a first portion with a first dimension in a third direction orthogonal to the first and second directions so as to have a first light propagation constant, and having a second portion with a second dimension in the third direction so as to have a second light propagation constant, the first dimension and the second dimension being different from each other, said second portion of said stripe-shaped active layer having a length L in the second direction,
said stripe-shaped active layer satisfying the condition that a product of $\Delta\beta$ and the length L is an odd multiple of $\pi/2$, where $\Delta\beta$ is the difference between the first and second light propagation constants.

2. A semiconductor laser as set forth in claim 1, wherein the second dimension is larger than the first dimension.

3. A semiconductor laser as set forth in claim 1, wherein the second dimension is smaller than the first dimension.

4. A semiconductor laser as set forth in claim 1, further comprising a stripe-shaped optical guide layer having a thickness in the first direction, having a third energy band gap greater than the first energy band gap and smaller than the second energy band gap, and extending in the second direction,
said stripe-shaped active layer and said stripe-shaped optical guide layer having substantially the same configuration when viewed from the first direction,
said stripe-shaped active layer being superimposed on said stripe-shaped optical guide layer in the first direction,
said diffraction grating being provided in said stripe-shaped optical guide layer.

5. A semiconductor laser as set forth in claim 4, wherein the second dimension is larger than the first dimension.

6. A semiconductor laser as set forth in claim 4, wherein the second dimension is smaller than the first dimension.

7. A semiconductor laser comprising:
a stripe-shaped active layer including first and second portions, said first portion having a first thickness in a first direction so as to have a first light propagation constant, said second portion having a second thickness in the first direction so as to have a second light propagation constant, the first and second thicknesses being different from each other, said stripe-shaped active layer having a first energy band gap and extending in a second direction orthogonal to the first direction;
a clad region surrounding said stripe-shaped active layer, having a second energy band gap greater than the first energy band gap and having first and second portions;
first and second electrodes adjacent to said first and second portions of said clad region, respectively; and
a diffraction grating provided in parallel with, and adjacent to, said stripe-shaped active layer, said second portion of said stripe-shaped active layer having a length L in the second direction, said stripe-shaped active layer satisfying the condition that a product of $\Delta\beta$ and the length L is an odd multiple of $\pi/2$, where $\Delta\beta$ is the difference between the first and second light propagation constants.

8. A semiconductor laser as set forth in claim 7, wherein the second thickness is greater than the first thickness.

9. A semiconductor laser as set forth in claim 7, wherein the second thickness is less than the first thickness.

10. A semiconductor laser as set forth in claim 7, further comprising:
a stripe-shaped optical guide layer extending in the second direction, having a thickness in the first direction, and having a third energy band gap greater than the first energy band gap and smaller than the second energy band gap, wherein:
said stripe-shaped active layer and said stripe-shaped optical guide layer have substantially the same configuration when viewed from the first direction;
said stripe-shaped active layer is superimposed on said stripe-shaped optical guide layer in the first direction; and
said diffraction grating is provided in said stripe-shaped optical guide layer.

11. A semiconductor laser as set forth in claim 10, wherein the second thickness is greater than the first thickness.

12. A semiconductor laser as set forth in claim 10, wherein the second thickness is less than the first thickness.

13. A semiconductor laser comprising:
a first electrode;
a substrate over said first electrode;
a stripe-shaped light waveguide region over said substrate, said stripe-shaped light waveguide region having a first portion with a first light propagation constant, and having a second portion with a second light propagation constant, said second portion of said stripe-shaped light waveguide region having a length L;
a clad region over said stripe-shaped light waveguide region;
a second electrode over said clad region; and
a diffraction grating provided in parallel with, and adjacent to, said stripe-shaped light waveguide region, said stripe-shaped light waveguide region satisfying the condition that a product of $\Delta\beta$ and the length L is an odd multiple of $\pi/2$, where $\Delta\beta$ is the difference between the first and second light propagation constants.

14. A semiconductor laser as set forth in claim 13, wherein said stripe-shaped light waveguide region comprises a striped-shaped active layer having a thickness in a first direction and extending in a second direction orthogonal to the first direction.

15. A semiconductor laser as set forth in claim 14, wherein:
said stripe-shaped active layer has a first energy band gap;
said clad region has a second energy band gap greater than the first energy band gap;
said first portion of said stripe-shaped active layer has a first dimension in a third direction orthogonal to the first and second directions; and
said second portion of said stripe-shaped active layer has a second dimension in the third direction, the first dimension and the second dimension being different from each other.

16. A semiconductor laser as set forth in claim 15, wherein the second dimension is greater than the first dimension.

17. A semiconductor laser as set forth in claim 15, wherein the second dimension is less than the first dimension.

18. A semiconductor laser as set forth in claim 13, wherein said stripe-shaped light waveguide region comprises:
- a stripe-shaped active layer having a thickness in the first direction, having a first energy band gap, and extending in a second direction orthogonal to the first direction; and
- a stripe-shaped optical guide layer extending in the second direction, having a thickness in the first direction, and having a third energy band gap, wherein:
  said clad region has a second energy band gap, where the third energy band gap is greater than the first energy band gap and smaller than the second energy band gap;
  said stripe-shaped active layer and said stripe-shaped optical guide layer have substantially the same configuration when viewed from the first direction;
  said stripe-shaped active layer is superimposed on said stripe-shaped optical guide layer in the first direction; and
  said diffraction grating is provided in said stripe-shaped optical guide layer.

19. A semiconductor laser comprising:
- a first electrode;
- a first clad layer over said first electrode, said first clad layer having a first energy band gap;
- a stripe-shaped optical guide layer, provided on said first clad layer so as to form an interfacial surface, and having a second energy band gap smaller than the first energy band gap;
- a substantially uniform corrugation formed by the interfacial surface between said first clad layer and said stripe-shaped optical guide layer; and
- a stripe-shaped active layer, formed on said stripe-shaped optical guide layer, and having a third energy band gap smaller than the first energy band gap, said stripe-shaped active layer having first parts each of which has a first width so as to have a first light propagation constant and having a second part which has a second width so as to have a second light propagation constant, said first width being different from said second width;
- a second clad layer, formed on said stripe-shaped active layer, and having a fourth energy band gap greater than said third energy band gap; and
- a second electrode over said second clad layer;
- said second part of said stripe-shaped active layer having a length L in the second direction;
- said stripe-shaped active layer satisfying the condition that a product of $\Delta\beta$ and the length L is substantially an odd multiple of $\pi/2$, where $\Delta\beta$ is the difference between the first and second light propagation constants.

20. A semiconductor laser as set forth in claim 19, wherein said stripe-shaped optical guide layer has the same width and shape as said stripe-shaped active layer.

21. A semiconductor laser as set forth in claim 19, further comprising a third clad region provided on both sides of said stripe-shaped active layer.

22. A semiconductor laser as set forth in claim 19, wherein the first parts of said stripe-shaped active layer are provided on opposite ends of said stripe, wherein the second part is positioned between the first parts, and wherein the second width is greater than the first width.

23. A semiconductor laser as set forth in claim 19, wherein the first parts of said stripe-shaped active layer are provided on opposite ends of said stripe, wherein the second part is positioned between the first parts, and wherein the second width is less than the first width.

24. A semiconductor laser comprising:
- a first electrode;
- a first clad layer over said first electrode, said first clad layer having a first energy band gap;
- a stripe-shaped optical guide layer, provided on said first clad layer, and having a second energy band gap smaller than the first energy band gap;
- a substantially uniform corrugation interface surface between said stripe-shaped optical guide layer and said first clad layer;
- a stripe-shaped active layer, formed on said stripe-shaped optical guide layer, and having a third energy band gap smaller than the first energy band gap, said stripe-shaped active layer having first parts provided on opposite ends of said stripe-shaped active layer, each of the first parts having a first width so as to provide a first light propagation constant, said stripe-shaped active layer having a second part provided between the first parts and having a second width so as to provide a second light propagation constant, the first width being different from the second width and the first light propagation constant being different from the second light propagation constant;
- a second clad layer, formed on said stripe-shaped active layer, and having a fourth energy band gap greater than the third energy band gap;
- said second part of said stripe-shaped active layer having a length L in the second direction;
- said stripe-shaped active layer satisfying the condition that a product of $\Delta\beta$ and the length L is substantially an odd multiple of $\pi/2$, where $\Delta\beta$ is the difference between the first and second light propagation constants.

25. A semiconductor laser as set forth in claim 24, wherein the first width is less than the second width.

26. A semiconductor laser as set forth in claim 24, wherein the first width is greater than the second width.

* * * * *

UNITED STATES PATENT AND TRADEMARK OFFICE
CERTIFICATE OF CORRECTION

PATENT NO. : 4,726,031

DATED : FEBRUARY 16, 1988

INVENTOR(S) : KIYOHIDE WAKAO ET AL.

It is certified that error appears in the above-identified patent and that said Letters Patent is hereby corrected as shown below:

Col. 5, line 11, "width" should be --widths--;

line 30, "$\Lambda/4$" should be --$\lambda/4$--.

Signed and Sealed this

Twenty-sixth Day of July, 1988

Attest:

DONALD J. QUIGG

Attesting Officer

Commissioner of Patents and Trademarks